United States Patent
Mascolo et al.

(10) Patent No.: US 10,050,190 B2
(45) Date of Patent: Aug. 14, 2018

(54) SILICON INTEGRATED, OUT-OF-PLANE HEAT FLUX THERMOELECTRIC GENERATOR

(71) Applicant: CONSORZIO DELTA TI RESEARCH, Milan (MI) (IT)

(72) Inventors: Danilo Mascolo, Bologna (IT); Antonietta Buosciolo, Ariano Irpino (IT); Giuseppe Latessa, Rome (IT); Georg Pucker, Pergine Valsugana (IT); Mher Ghulinyan, Melta di Gardolo (IT); Simone Di Marco, Florence (IT)

(73) Assignee: CONSORZIO DELTA TI RESEARCH, Milan (MI) (IT)

( * ) Notice: Subject to any disclaimer, the term of this patent is extended or adjusted under 35 U.S.C. 154(b) by 0 days.

(21) Appl. No.: 15/464,564

(22) Filed: Mar. 21, 2017

(65) Prior Publication Data

US 2017/0194549 A1  Jul. 6, 2017

Related U.S. Application Data

(63) Continuation-in-part of application No. PCT/IB2015/057194, filed on Sep. 18, 2015.

(30) Foreign Application Priority Data

Sep. 22, 2014 (IT) .............................. MI2014A1637

(51) Int. Cl.
*H01L 35/30* (2006.01)
*H01L 35/32* (2006.01)
(Continued)

(52) U.S. Cl.
CPC .............. *H01L 35/32* (2013.01); *H01L 35/22* (2013.01); *H01L 35/34* (2013.01)

(58) Field of Classification Search
CPC ....................................................... H01L 35/32
See application file for complete search history.

(56) References Cited

U.S. PATENT DOCUMENTS

| 7,531,739 B1 | 5/2009 | Moczygemba |
| 7,875,791 B2 | 1/2011 | Leonov et al. |

(Continued)

FOREIGN PATENT DOCUMENTS

| EP | 1083610 A1 | 3/2001 |
| JP | H04101472 A | 4/1992 |

(Continued)

OTHER PUBLICATIONS

International Search Report and Written Opinion for International Application No. PCT/IB2015/057194 (10 Pages) (dated Oct. 30, 2015).

(Continued)

*Primary Examiner* — Eli Mekhlin
(74) *Attorney, Agent, or Firm* — Lucas & Mercanti, LLP

(57) ABSTRACT

An enhanced electrical yield is achieved with an integrated thermoelectric generator (iTEG) of out-of-plane heat flux configuration on a substrate wafer having hill-top junction metal contacts and valley-bottom junction metal contacts joining juxtaposed ends of segments, alternately p-doped and n-doped, of defined thin film lines of segments of a polycrystalline semiconductor, extending over inclined opposite flanks of hills of a material of lower thermal conductivity than the thermal conductivity of the thermoelectrically active polycrystalline semiconductor, by keeping void the valleys spaces (V) among the hills and delimited at the top by a planar electrically non conductive cover with metal bond pads defined over the coupling surface, adapted to bond with respective hill-top junction metal contacts. The junction metal contacts have a cross sectional profile of low aspect ratio, with two arms or wings overlapping the juxta- (Continued)

posed end portions of the segments. Preferably the inner void is evacuated upon packaging the iTEG.

11 Claims, 4 Drawing Sheets

(51) Int. Cl.
*H01L 35/22* (2006.01)
*H01L 35/34* (2006.01)

(56) References Cited

U.S. PATENT DOCUMENTS

| | | | |
|---|---|---|---|
| 2004/0145049 A1* | 7/2004 | McKinnell | G11B 9/10 |
| | | | 257/719 |
| 2005/0279104 A1 | 12/2005 | Leija et al. | |
| 2006/0102223 A1 | 5/2006 | Chen et al. | |
| 2006/0210790 A1* | 9/2006 | Horio | B23K 35/0244 |
| | | | 428/323 |
| 2010/0163089 A1* | 7/2010 | Donley | H01L 35/32 |
| | | | 136/203 |
| 2013/0307200 A1* | 11/2013 | Carberry | C04B 35/64 |
| | | | 264/614 |
| 2014/0167267 A1 | 6/2014 | Uzoh et al. | |
| 2014/0190542 A1* | 7/2014 | Lane | H01L 27/16 |
| | | | 136/212 |
| 2015/0280099 A1* | 10/2015 | Boukai | H01L 35/32 |
| | | | 136/203 |

FOREIGN PATENT DOCUMENTS

| | | |
|---|---|---|
| JP | H10303469 A | 11/1998 |
| JP | 2005328000 A | 11/2005 |
| WO | 2005001946 A1 | 1/2005 |
| WO | 2009100809 A2 | 8/2009 |
| WO | 2009125317 A2 | 10/2009 |
| WO | 2011007241 A1 | 1/2011 |
| WO | 2011073142 A1 | 6/2011 |

OTHER PUBLICATIONS

International Search Report and Written Opinion for International Application No. PCT/IB2015/057353 (12 Pages) (dated Nov. 12, 2015).

International Search Report and Written Opinion for International Application No. PCT/IB2015/057325 (12 Pages) (dated Nov. 12, 2015).

* cited by examiner

SILICON INTEGRATED, OUT-OF-PLANE HEAT FLUX THERMOELECTRIC GENERATOR

CROSS-REFERENCE TO RELATED APPLICATIONS

This application is a Continuation-In-Part of PCT/IB2015/057194, filed Sep. 18, 2015, which claims the benefit of priority of Italian Application No. MI2014A001637 filed on Sep. 22, 2014, the contents of each of which are incorporated herein by reference.

BACKGROUND

Technical Field

This disclosure relates in general to solid state thermoelectric devices, in particular to thermoelectric generators (TEGs) amenable to be fabricated with planar processing technologies and related techniques of heterogeneous or hybrid 3D integration.

Discussion of Related Prior Art

Thermoelectric generators (TEGs) are earnestly investigated as low enthalpy waste heat exploitation devices of outstanding robustness, reliability and virtually unlimited service life, besides being made of environmental friendly materials.

As power consumption of increasingly popular electronic devices is constantly minimized, TEGs begin to be considered as supplementary power source in conjunction or even in substitution of batteries or other energy storage devices like super-capacitors.

There is an increasing number of publications concerning thin film technology TEGs exploiting well established processing techniques developed in the Microelectronics and Micro-Electro-Mechanical-Systems (MEMSs), like planar processing, micromachining implant and post implant treatments, flip-chip and bonding techniques and alike.

The doctorate thesis "Silicon-Micromachined Thermoelectric Generators for Power Generation from hot gas streams" by Israel Boniche, University of Florida, 2010, and "Monolithic integration of VLS silicon nanowires into planar thermoelectric generators" by Diana Davila Pineda, Autonomous University of Barcelona, 2011, offer an extensive introductory review of state-of-the-art practices in the field of thermoelectric devices for solid state heat pumps and power generators.

The review encompasses also two families of TEGs manufactured with silicon-compatible micro and nano technologies: in devices of a first family heat flow is parallel and in the other family orthogonally to the substrate. The architectures of these integrated TEGs generally comprise a number of elementary cells having n-p doped legs, arranged in such a way that the elementary cells are thermally in parallel and electrically in series.

Typically, integrated TEG devices in which heat flows parallel to the substrate may have conductive legs of thermoelectrically active materials deposited over a very high thermal resistance material or a membrane, suspended several hundreds of micrometers above the substrate, or the legs of active materials themselves are free-standing [membraneless].

Other relevant examples are reported in :

Huesgen, T.; Wois, P.; Kockmann, N Design and fabrication of MEMS thermoelectric generators with high temperature efficiency. Sens. Actuators A 2008, 145-146, 423-429.

Xie, J.; Lee, C.; Feng, H. Design, fabrication and characterization of CMOS MEMS-based thermoelectric power generators. J. Micromech. Syst. 2010, 19, 317-324.

Wang, Z.; Leonov, V.; Fiorini, P.; van Hoof, C. Realization of a wearable miniaturized thermoelectric generator for human body applications. Sens. Actuators A 2009, 156, 95-102.

Wang, Z.; Fiorini, P.; Leonov, V.; van Hoof, C. Characterization and optimization of polycrystalline Si70% Ge30% for surface micromachined thermopiles in human body applications. J. Micromech. Microeng. 2009, doi: 10.1088/0960-1317/19/9/094011.

Su, J.; Leonov, V.; Goedbloed, M.; van Andel, Y.; de Nooijer, M. C.; Elfrink, R.; Wang, Z.; Vullers, R. J. A batch process micromachined thermoelectric energy harvester: Fabrication and characterization. J. Micromech. Microeng. 2010, doi: 10.1088/0960-1317/20/10/104005.

Yang, S. M.; Lee, T.; Jeng, C. A. Development of a thermoelectric energy harvester with thermal isolation cavity by standard CMOS process. Sens. Actuators A 2009, 153, 244-250.

Kao, P.-H.; Shih, P.-J.; Dai, C.-L.; Liu, M.-C. Fabrication and characterization of CMOS-MEMS thermoelectric micro generators. Sensors 2010, 10, 1315-1325.

Wang, Z.; van Andel, Y.; Jambunathan, M.; Leonov, V.; Elfrink, R.; Vullers, J. M. Characterization of a bulk-micromachined membraneless in-plane thermopile. J. Electron. Mater. 2011, 40, 499-503.13.

U.S. Pat. No. 7,875,791 B1 "Method for manufacturing a thermopile on a membrane and a membrane-less thermopile, the thermopile thus obtained and a thermoelectric generator comprising such thermopiles" Vladimir Leonov, Paolo Fiorini, Chris Van Hoof (2011)

Miniaturized thermopile on a membrane are also described by A. Jacquot, W. L Liu, G. Chen, J. P Flrial, A. Dauscher, B. Lenoir, in "Fabrication and Modeling of an in-plane thermoelectric micro-generator", Proceedings ICT'02. 21st International Conference on Thermoelectrics, p. 561-564 (2002).

Other examples of parallel heat flow TEG structures rely on the ability of growing or defining populations of parallel and extremely slender conductors (nanowires) with a mean diameter of few tens of nanometers on a planar substrate of low heat conductivity and in eventually stacking tile-modules to form a thermo-electrical active septum, through which heat flows in the same direction of the parallel nanowires. The articles: "A. I. Hochbaum, R. K. Chen, R. D. Delgado, W. J. Liang, E. C. Garnett, M. Najarian, A. Majumdar, and P. D. Yang, Nature 451, 163-U5 (2008)" and "A. I. Boukai, Y. Bunimovich, J. Tahir-Kheli, J.-K. Yu, W. A. Goddard Iii, and J. R. Heath, Nature 451, 168-171 (2008)"; WO2009/125317; EP1,083,610; WO2011/007241; WO2011/073142; offer a review of practices following such an approach.

U.S. Pat. No. 7,875,791 B1 (by Leonov et al.) discloses thermopiles that may be supported by a membrane layer or that may be self-supporting. Despite the apparent easy manufacturability of these devices, heat is forced to move in a complicated structure with significant thermal losses. In addition, in some cases adhesive are needed in order to assure thermal contact to a heat source at the top or the bottom surface of the initial substrate. This results in poor thermal coupling at system level, lossy thermal paths and mechanical fragilities, all features that penalize performance of the thermopile.

A second family of TEG devices is often referred to as "out-of-plane" heat flux TEGs. They are characterized by the fact that heat flows orthogonally to the substrate. In these devices the thermoelectrically active materials are usually laid on or are part of high aspect-ratio supporting structures standing onto the substrate. Despite a more sophisticated and apparently expensive fabrication process, this configuration minimizes thermal losses, simplifies thermal coupling at system level enhancing overall performance.

Being manufactured with conventional CMOS\BiCMOS\MEMs materials and processes, the "out-of-plane" heat flux TEGs are amenable to miniaturization and integration in microelectronic and optoelectronic devices, among other applications.

Examples are reported by M. Strasser et al. in "Miniaturized Thermoelectric Generators Based on Poly-Si and Poly-SiGe Surface Micromachining", (presented in The 11th International Conference on Solid-State Sensors and Actuators, Munich, Germany, Jun. 10-14, 2001) and "Micromachined CMOS Thermoelectric Generators as On-Chip Power Supply" (presented in The 12$^{th}$ International Conference on Solid-State Sensors and Actuators and Microsystems, Boston, USA, Jun. 8-12, 2003).

Out-of-plane or orthogonal heat flux thin film structures are useful for innumerable applications, for example for micro power generation or for temperature management in complex integrated systems, for energy recovery or harvesting Electric power yield from a given heat flow and electric power yield versus the footprint area of out-of-plane or orthogonal heat flux devices of the prior art, based on a common semiconductor or any material compatible with ICs fabrication processes, are yet poor and there is a need of more efficient and power intensive devices.

SUMMARY OF THE DISCLOSURE

A significantly increased conversion efficiency is achieved with a silicon integration compatible out-of-plane (or orthogonal) heat flux TEG having a novel "Z-device" structure as defined in the appended claims, the content of which is intended to be integral part of this description and herein incorporated by express reference.

Basically, internal by-pass heat transfer by heat conduction normally occurring through a dielectric filler, typically an oxide (e.g. silicon oxide) deposited in the valleys over defined tracts or segments of sequentially alternated p-type and n-type deposited semiconductor thin-film and over metal bridges that provide electrical continuity between juxtaposed ends of defined segments of p-type and of n-type semiconductor at valley bottom junctions, between spaced hills of generally trapezoidal cross section, over opposite slanted flanks of which lay the defined semiconductor thin-film legs of an elementary cell of a typical Z-device profile, is significantly reduced by realizing junction metal contacts of relatively low profile (i.e. low aspect ratio) and reduced encumbrance and by leaving void the valley spaces, thus no longer filled with dielectric oxide nor hosting metal bridges of high profile of electrical connection of juxtaposed ends of a p-type and an n-type leg.

Reducing internal by-pass heat transfer from hot metal junctions to cold metal junctions of a Z-device has a dominant effect on efficiency, in view of the fact that the delivered electrical power of an integrated thermoelectric generator (iTEG) besides other factors is tied to the second power of the temperature difference between the two tiers of metal contacts.

According to a preferred embodiment, the void spaces are evacuated upon packaging the finished device for substantially eliminating heat convection contribution there through to heat transfer from hot junction metal contacts to cold junction metal contacts along by-pass paths, rather than the thermoelectrically useful heat conduction paths along the semiconductor thin-film lines of the Z-device structure.

According to an aspect of the novel architecture, both the valley-bottom and hill-top junction metal contacts, connecting p-doped and n-doped thin film segments of a line of doped polycrystalline semiconductor (e.g. of heavily doped poly-Si or poly-SiGe), respectively extending over one side and the opposite side flank of every dielectric\thermal insulating hill of a line of regularly spaced hills, are in form of defined tracts of a deposited metal layer, partly overlapping the juxtaposed end portions of a p-doped and of a n-doped leg of a semiconductor thin film for connecting electrically in series alternated cold and hot thermoelectric junctions thus organized in a single or in a plurality of chains.

The hills may generally have a truncated rectangular pyramid shape or they may have a trapezoidal cross section along one axis and straight sides or flanks orthogonal to it, though other shapes including that of a truncated cone could be used.

The hills material should have a low thermal conductivity, lower than the thermal conductivity of the material of the p-type and n-type legs of material supported thereon. The hills may be of a thermally grown (e.g. a so-called locos oxide) or of a deposited layer of a material such as oxides, oxy-nitrides, silicon nitride or even of purposely formed nanometer length scale structures of phononic material such as superlattices of nanoscale thin films of silicon, eventually to be successively masked and etched under controlled etching conditions and/or in an eventually stepwise manner, in order to slant the walls of etched valleys toward a substantially flat bottom.

This shape of the junction metal contacts, as far as the valley-bottom junctions (either hot or cold relatively to coherently cold or hot hill-top junctions) are concerned, leaves interior separation spaces between adjacent hills, over the inclined flanks of which lay the thin film conductive legs of p-doped and n-doped semiconductor, substantially unobstructed for fully exploiting the reduced heat transfer afforded by the empty spaces.

These internal void spaces are closed at the top by a planar cover having metal contacts defined over a coupling surface of the planar cover, adapted to bond with respective hill-top junction metal contacts.

DETAILED DESCRIPTION OF EMBODIMENTS

Figure 1:
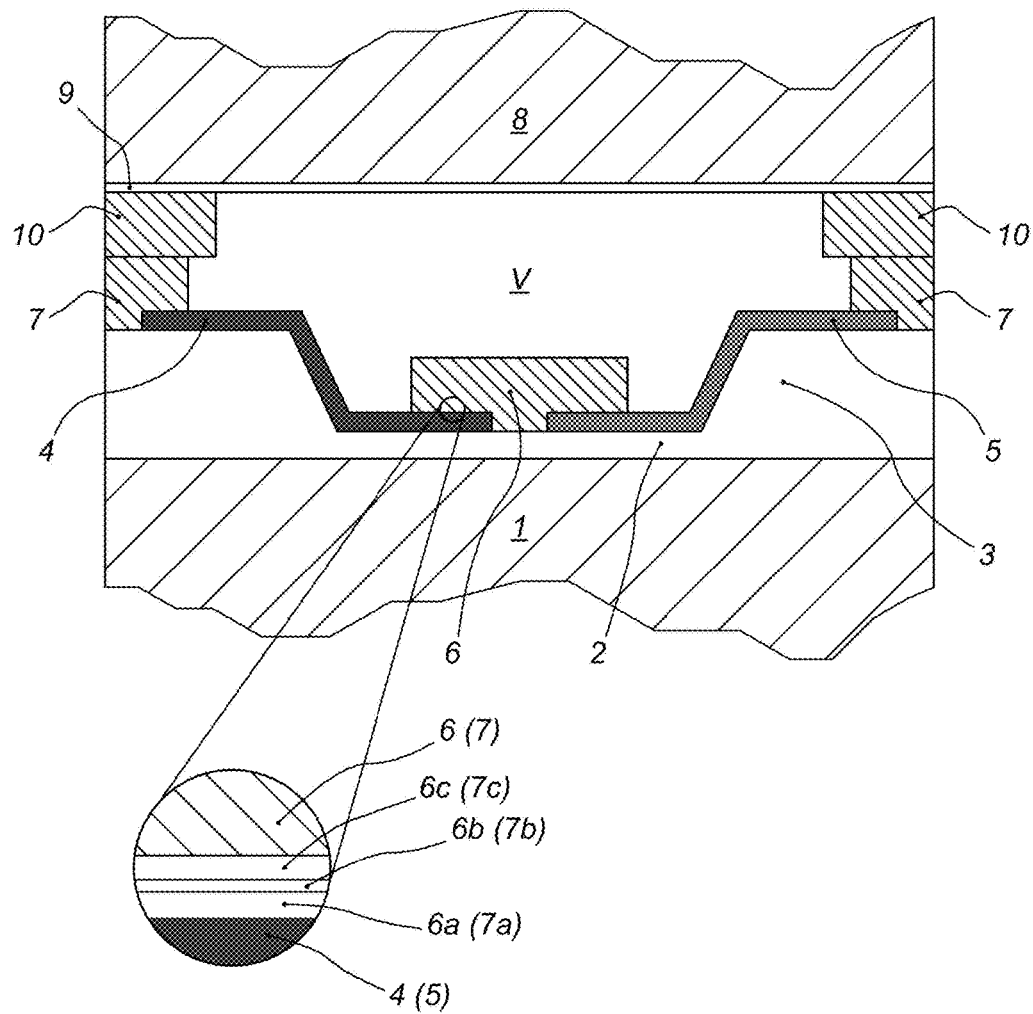
FIG. 1 is a cross sectional view of the elementary cell of an integrated Z-device according to a basic embodiment of this disclosure.
Figure 2:
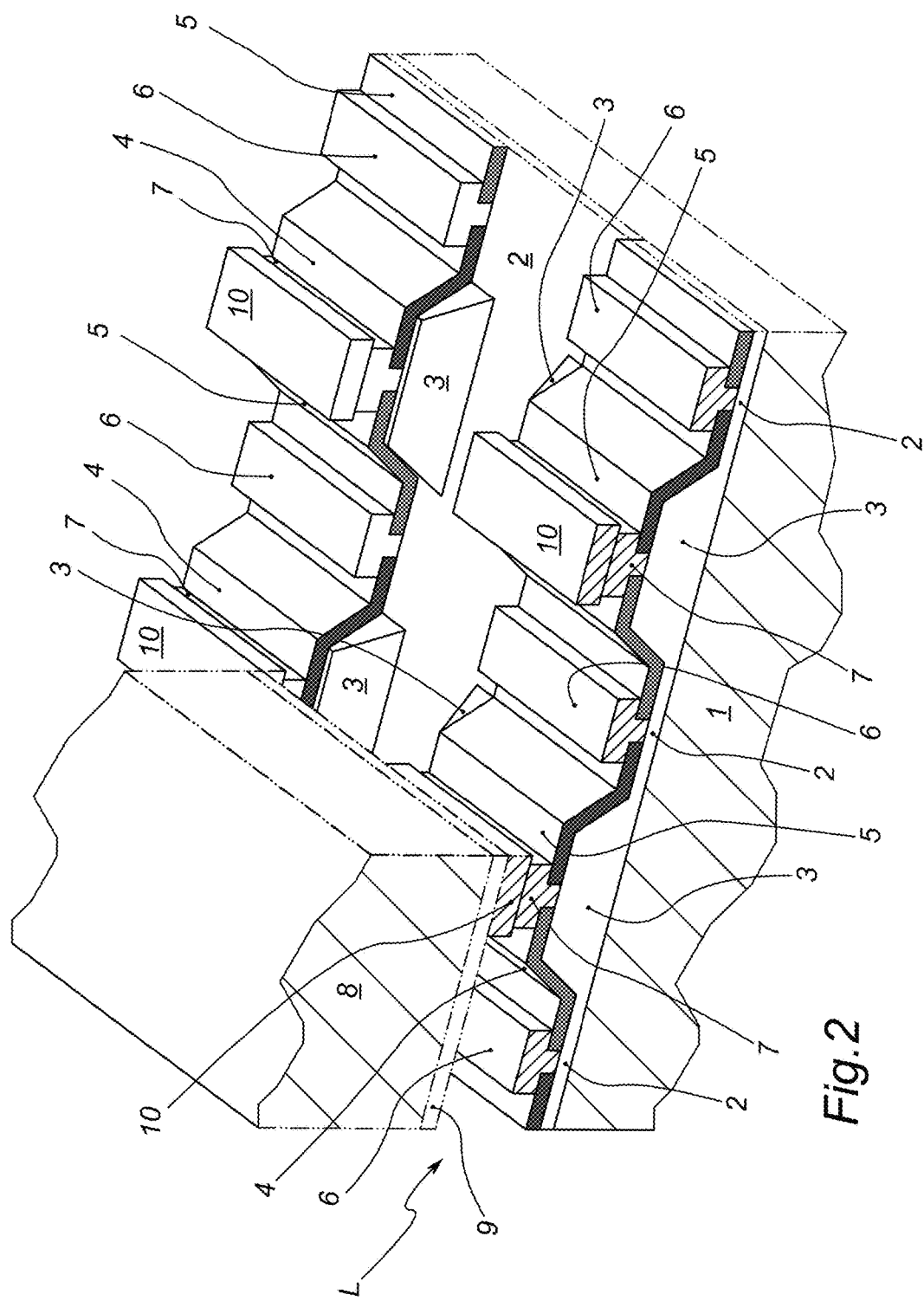
FIG. 2 is a fragmentary, three dimensional cross sectional view showing two lines of elementary cells of the integrated Z-device structure.

With reference to FIG. 1 and FIG. 2, a silicon wafer 1 is used as substrate for fabricating thereon the novel Z-device structure of an integrated TEG of out-of-plane (orthogonal) heat flux type.

Commercially available silicon wafers of any size and having a thickness generally not exceeding 675 micrometers (μm) may be used.

A dielectric base layer 2 of substantially uniform thickness that may be generally comprised between 1 nanometer (nm) and 1 micrometer (μm), preferably of about 10 nm, provides a necessary bottom electrical insulation without introducing a significant thermal resistance.

According to well established techniques of micro-machining processing, arrangement of spaced hills 3 of a relatively low thermal conductivity material such as, for example, of thick oxide, thermally grown or deposited over unmasked areas of a firstly grown base layer 2, up to a height that generally may be comprised between 0.1 and 50 μm. The typical inclined flanks of hills 3 define valleys there between, the substantially planar bottom of which generally may have a width comprised between 0.1 and 100 μm, most preferably between 0.2 and 50 μm, similarly to the width of the top of the hills 3.

Alternatively, the hills 3 may be defined starting from a layer of deposited oxide or other material such as silicon nitride, through a succession of masking and etching steps, under controlled isotropic etching conditions, in order to slant the walls of the progressively etched valleys toward a substantially flat bottom by an angle of inclination from the base plane that preferably is comprised between 45 and 85 degrees.

LPCVD silicon oxide, deposited with varying amounts of phosphorous and/or hydrogen impurities and specific processing and post processing conditions promoting structural disorder (re: Y. S. Ju and K. E. Goodson,"*Process-dependent thermal transport properties of silicon-dioxide films deposited using low-pressure chemical vapor deposition*", AIP Journal of Applied Physics, Volume 85, Number 10, 7130-7134) is also an effective material with which hills 3 of enhanced resistance to heat conduction may be formed over the oxidized surface of the substrate wafer 1.

Yet another alternative material with which hills 3 of enhanced resistance to heat conduction with two suitably inclined opposite sides may be formed over an oxidized surface of a substrate wafer is the family of nanomesh structures of phononic silicon (re:"Reduction of thermal conductivity in phononic nanomesh structures" by Jen-Kan Yu, S. Mitrovic, D. Tham, J. Varghese and J. R. Heath, Nature Nanotechnology, Vol. 5, October 2010, ©2010 Macmillan Publishers Lim.).

The hills material should have a low thermal conductivity, significantly lower than the thermal conductivity of the material of the p-type and n-type legs of conductive material supported thereon, in order to further penalize by-pass paths of heat conduction flow alternative to the paths of productive heat conduction along the polycrystalline doped semiconductor thin film segments or legs defined over opposite slanted surfaces of the truncated rectangular pyramid shaped hills 3 or of hills with a trapezoidal cross section along one axis and straight sides or flanks orthogonal to it.

Examples of suitable materials of lower thermal conductivity than the thermal conductivity of a thermoelectrically active polycrystalline semiconductor and their respective heat conduction coefficients are reported in the following table.

| Material | Thickness [nm] | Conductivity [W m$^{-1}$ K$^1$] |
|---|---|---|
| Thermal SiO2 | >250 | ~1.2 |
| SiO2 (PECVD@300 C.) | 30-50 | 0.82 ± 0.02 |
| SiO2 (PECVD@300 C.) | 90-180 | 1.00 ± 0.10 |
| SiO2 (PECVD@300 C.) | >200 | ~1.2 (Bulk) |
| SiNx (PECVD@300 C.) | 20-40 | 0.55 ± 0.05 |
| SiNx (PECVD@300 C.) | 60-120 | 0.65 ± 0.05 |
| SiNx (APCVD@900 C.) | 180 | ~1.45 |

Hills 3 of a superlattice of nanoscale thin films of phononic silicon realized over a dielectric base layer on the surface of the substrate is another alternative capable of markedly reducing the thermal conductivity of the hills 3 of the integrated TEG structure.

Parallel lines of defined tracts or segments of alternately p-doped and n-doped, 4 and 5, respectively, of a polycrystalline semiconductor material such as, for example, doped Si or SiGe, deposited in form of a thin film of substantially uniform thickness over the bottom isolation dielectric 2 and the spaced hills 3, constitute the two legs of thermoelectric material that electrically connect a junction at the valley bottom to the two adjacent junctions on top of the hills 3 (i.e. a unit or elementary cell of a Z-device structure). The deposited doped polycrystalline silicon layer of the segments 4 and 5 may have thickness, generally comprised between 10 and 1000 nm, but may even be as thick as one or more micrometers, depending on contemplated applications, scaling of the elementary cell structure, properties of the polycrystalline semiconductor material used and design choices of the integrated TEG.

Physically, the cold and hot junctions, respectively at valley bottoms and at hill-tops or vice versa, are both constituted by metal contacts of low aspect ratio, respectively 6 and 7, electrically bridging an interruption gap between the defined end of a p-doped segment or leg 5 and the defined end of a n-doped thermoelectric segment or leg 4 of polycrystalline thin-film semiconductor, in order to avoid formation of p-n junctions along the string of elementary integration modules or cells in series of an electrically conductive line (chain) of cells.

The deposited metal layer of the junction metal contacts 6 and 7 that extend over and in electrical contact with the end portions of the two segments 4 and 5 of polycrystalline semiconductor, for a good part of their portions laying onto the substantially planar valley bottoms and hill-tops, may have thickness ranging from about 0.1 to about 5 μm.

The cross sectional view of the drawing well represents the characteristic "Z profile" of the conductive legs 4 and 5 of thermo-electrically active material of the elementary cell.

Preferably, there is a multi-layer interfacing between the metal overlapping the polycrystalline semiconductor thin film to control the electrical interface resistance between the metal and the semiconductor materials thereat and eventually disproportionate electrical conductivity versus thermal conductivity for reducing heat conduction toward the metallic bulk of the metal contacts, namely, the valley bottom contacts 6 and the hill-top contacts 7. As depicted in the enlargement lens, an effective interfacing multi-layer may comprise a 1-50 nm film 6a of a silicide belonging to the group: $TiSi_2$, $WSi_2$, $MoSi_2$, $PtSi_2$ and $CoSi_2$, in contact with the polycrystalline doped semiconductor, an intermediate 1-10 nm thick film 6b of W or Ti and a 5-30 nm thick film 6c of TiN in contact with the metal layer 6, 7 of Al or of Al—Si alloy or copper.

According to a preferred embodiment of the novel integrated out-of-plane TEG structure, the void valley spaces among parallel lines or other arrangement of spaced hills 3 are closed at the top by a second wafer 8, provided with a thin dielectric layer 9 formed over a surface of the wafer to render it electrically non-conductive, and over which are then defined metal bond pads 10, adapted to bond with respective hill-top metal contacts 7 according to one of the many flip-chip bonding techniques, preferably using an aligned-bonding technique of thermo-compressive metal-to-metal bonding Cu—Cu,W—W, Ti—Ti . . . etc., with or without diffusion layers, after a CMP planarization, or via plasma bonding (Y—Ox/Y—Ox), PECVD SiO2-SiO2, benzocyclobutene (BCB) to BCB bonding. Hybrid bonding techniques such as BCB and a variety of polymers or polymides, metal layers such Ti films and inter-metallic compounds (IMCs), Cu—Sn Solid-Liquid-Interdiffusion (SLID) bonding, Au—Sn or Au—In eutectic bonding, may alternately be used as well as anodic bonding or micro-bump stacking.

Also the so-called smart-cut processing or the layer transfer technology Smart Stacking™ of Soitec, described in U.S. Pat. No. 5,374,564, may be used.

Flip-chip aligned bonding, may be carried out on whole processed wafers, from which TEG device dices are successively cut to be packaged, or alternatively on cut dices thereof Generally, depending on the specific application, aligned bonding for realizing the TEG devices of this disclosure may be carried out in chip-to-chip, chip-to-wafer, wafer-to-wafer mode or according to chip-on-wafer-on-substrate or chip-on-chip-on-substrate approaches.

Preferably, both the top and bottom wafers may be subjected to a backside thinning process aiming to reduce the thickness of commercial wafers, after devices manufacturing, including mechanical or chemical treatments, such as mechanical grinding, dry polishing, chemical-mechanical grinding, spin etching chemical-mechanical polishing and plasma dry etching. The aim is to reduce the original thickness to less than 100 μm or to ultrathin values of less than 40 μm. Thinning of the wafers reduces overall thermal resistance of the integrated out-of-plane TEG structure and makes it amenable to be deployed in next generation 3D integrated circuit.

A fragmentary, three dimensional cross sectional sketch, showing the features of two lines L of elementary cells of the integrated Z-device structure may be observed in FIG. 2.

The manner in which parallel electrically conductive lines of defined tracts or segments of alternately p-doped and n-doped, 4 and 5, of a semiconductor material, joined by valley-bottom and hill-top junction metal contacts 6 and 7 are created, orthogonally to array lines of spaced hills 3, may be immediately recognized.

The width of the conductive lines L may be generally comprised between 0.1 and 500 μm, more preferably between 0.5 and 10 μm.

Figure 3:
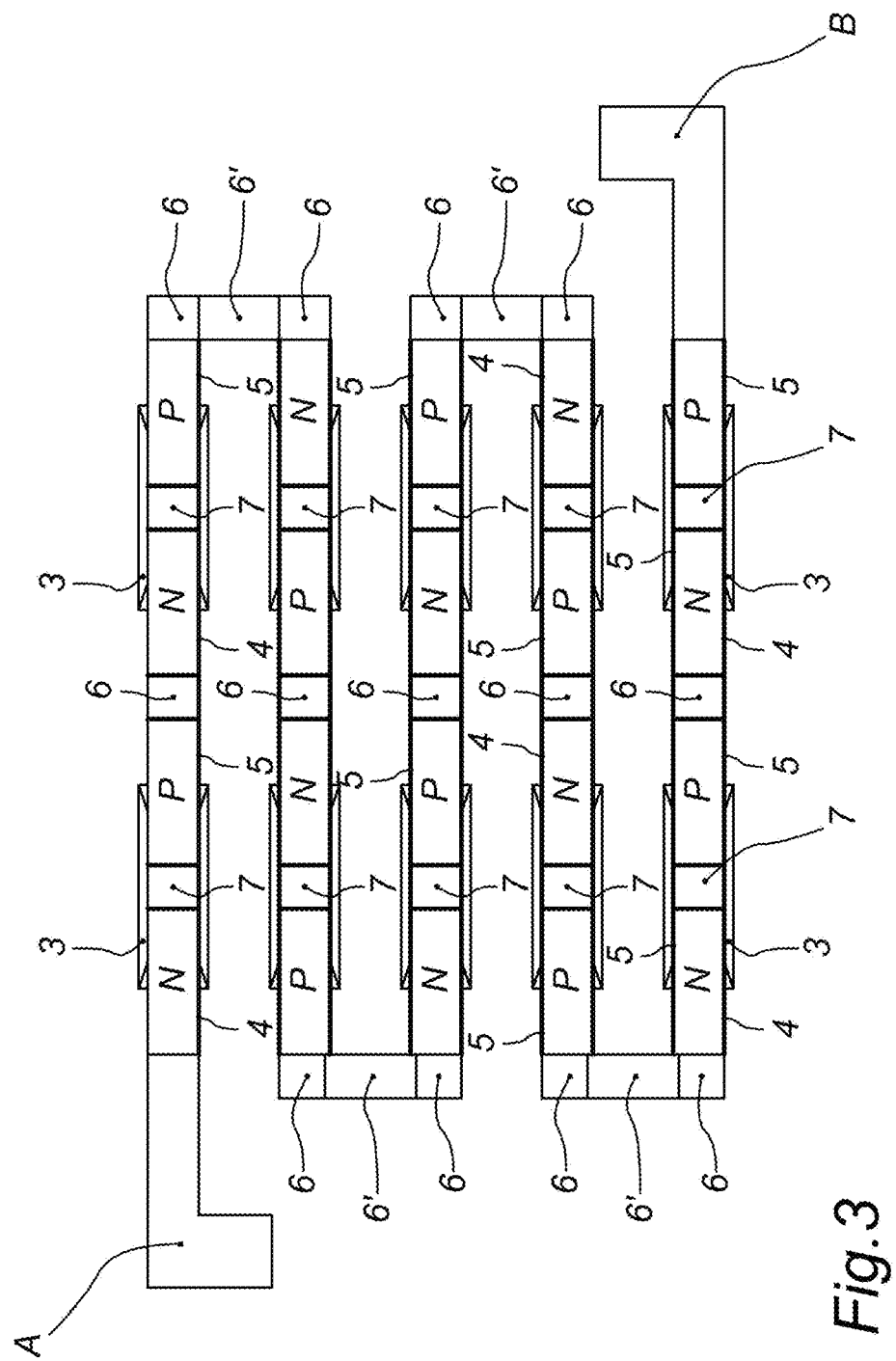
FIG. 3 shows a possible layout of parallel conductive lines of elementary cells constituting an integrated TEG module of a string of a number of cells in electrical series with connection pads to circuit.

A plurality of lines L of microcells are normally connected in electrical series, for example in an arrangement of a number of adjacently integrated parallel lines. FIG. 3 shows an exemplary layout of the electrically conductive parts of five parallel lines L of elementary cells, for constituting an integrated TEG module composed of a string of cells in electrical series corresponding to the sum of the number of cells of all the lines L terminating with connection pads A and B.

Connection of the adjacent ends of two lines L is realized by defining lateral metal connections 6', i.e. defining by masking and selective etching step a secondly deposited metal layer, after having removed a firstly deposited metal layer for filling the gap space between the opposed ends of the polycrystalline semiconductor legs 4 and 5 from planar surfaces.

Figure 4:
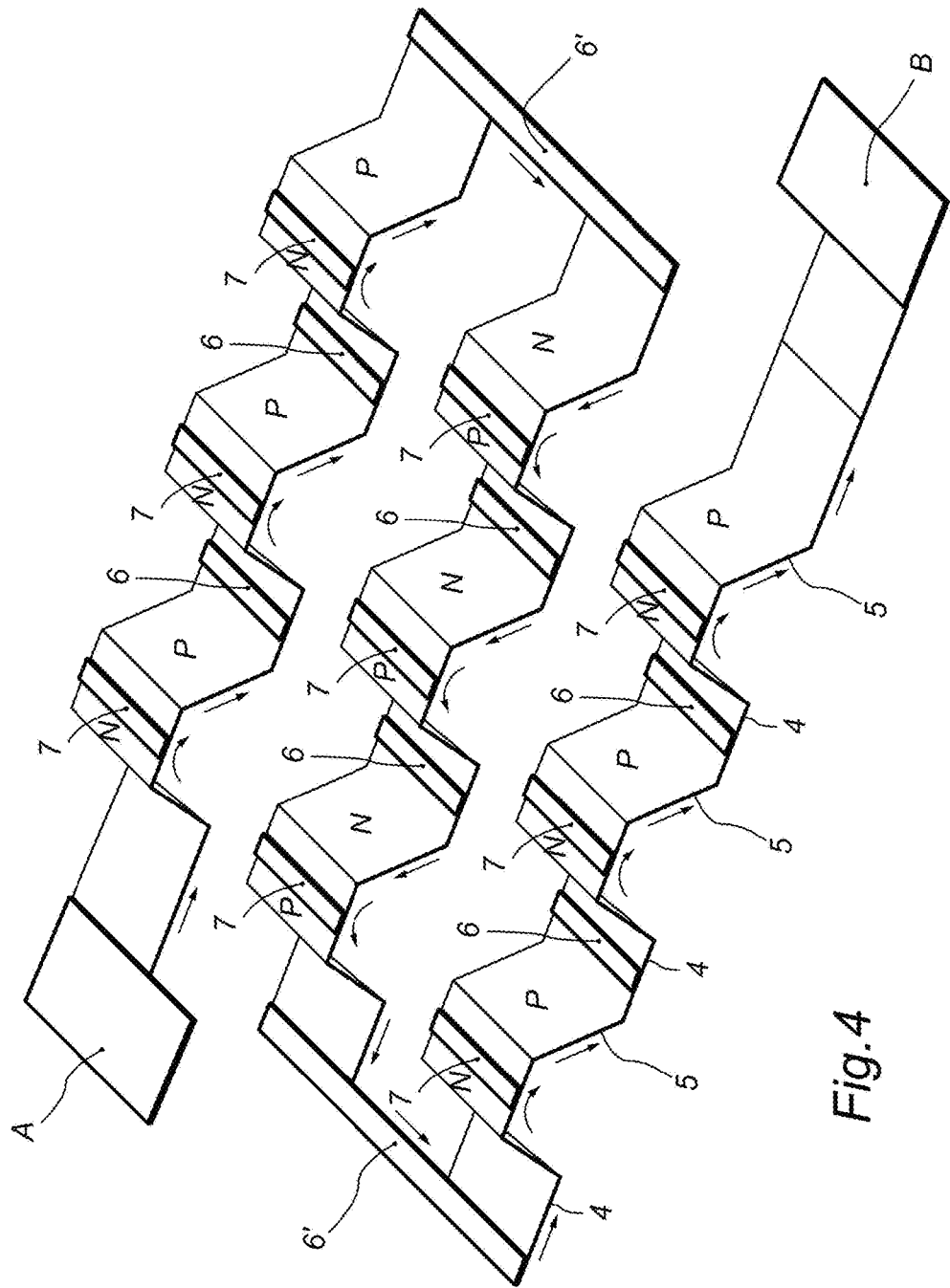
FIG. 4 is a three dimensional view of an arrangement of the conductive parts of the integrated cells in series showing the flow path of electrical current generated by the integrated TEG device under a temperature difference between hot hill top metal junctions and cold valley bottom metal junctions.

In the tri-dimensional view of the arrangement of the conductive parts of the cells in series of FIG. 4, arrow heads describe the flow path of electrical current generated by the integrated TEG device under a temperature difference between hot hill-top metal junctions 7 and cold valley-bottom metal junctions 6.

Of course, the DC voltage produced at the terminals A and B corresponds to the sum of the DC voltage developed by every elementary series connected cell of the string.

A TEG device may include numerous modularly integrated multi-cell TEGs, each requiring two pads for connecting to one or several external circuits harvesting or exploiting the generated electrical power according to application needs. In order for one or several series/parallel networks of the plurality of monolithically integrated TEGs of a packaged device to be externally organized, the device must account for two pins for each individual integrated TEG. Therefore, an appropriate multi-TEG layout of monolithic integration, besides providing for the desired number of individually integrated TEGs must be compatible with the maximum number of pins that the packaged device may have.

Alternatively, the finished TEG device may have few output pin pairs or even be a two-pin device by choosing to maximize serialization in order to achieve a large open-circuit output voltage.

The invention claimed is:

1. An integrated thermoelectric generator of out-of-plane heat flux configuration, comprising:
   a substrate wafer,
   a layer of a single material deposited on said substrate wafer, forming hills and valleys all made of said single material,
   thin film lines of segments of a polycrystalline semiconductor, alternately p-doped and n-doped, entirely defined on and extending on inclined opposite flanks of said hills of said layer made of said single material;
   said material having a lower thermal conductivity than the thermal conductivity of said polycrystalline semiconductor,
   hill-top junction metal contacts and valley-bottom junction metal contacts, deposited on and joining juxtaposed ends of segments, alternately p-doped and n-doped, of said defined thin film lines of segments of a polycrystalline semiconductor,
   wherein
   all said valleys among said hills are void spaces (V) delimited from above by a planar electrically non-conductive cover having metal bond pads, defined over a coupling surface of the planar cover, bonded with said respective hill-top junction metal contacts,
   wherein said single material, of which all hills and said valleys of said layer are made, is selected from the group consisting of silicon oxide, silicon nitride, deposited oxides of enhanced resistance to heat conduction, nanomesh structures of phononic material, and superlattices of nanoscale thin film silicon, wherein said hill top junction metal contacts have a cross sectional profile with two arms or wings overlapping juxtaposed end portions of a p-doped and of an n-doped segment, respectively, of a defined line (L) of segments of polycrystalline semiconductor.

2. The thermoelectric generator of claim 1, wherein side gaps between the substrate wafer and said planar cover are occluded so as to permanently seal said void spaces (V).

3. The thermoelectric generator of claim 1, wherein side gaps between the substrate wafer and said planar cover are occluded so as said void spaces (V) are permanently sealed under vacuum.

4. The thermoelectric generator of claim 1, wherein said planar cover is a wafer similar to the substrate wafer, and has a dielectric film over the coupling surface that electrically insulates from one another said metal bond pads defined thereon.

5. The thermoelectric generator of claim 4, wherein said substrate wafer or said cover wafer are thinned or ultra-thinned silicon wafers.

6. The thermoelectric generator of claim 5, wherein said planar cover is a silicon wafer similar to the substrate wafer.

7. The thermoelectric generator of claim 5, wherein the substrate silicon wafer and the planar cover silicon wafer are micro-machined wafers bonded together.

8. The thermoelectric generator of claim 1, wherein said metal contacts are of aluminum, copper, silver or alloys thereof.

9. The thermoelectric generator of claim 1, wherein electrical contact of said overlapping metal contact arms with the polycrystalline semiconductor thin film takes place via an interfacing multi-layer comprising a film of a silicide selected from the group consisting of $TiSi_2$, $WSi_2$, $MoSi_2$, $PtSi_2$ and $CoSi_2$.

10. The thermoelectric generator of claim 1, wherein electrical contact of said overlapping metal contact arms with the polycrystalline semiconductor thin film takes place via an interfacing multi-layer comprising an intermediate film of a refractory metal selected from the group consisting of W, Ti, Ta and a film of titanium nitride in contact with the metal.

11. The thermoelectric generator of claim 1, wherein said hills are regularly spaced along parallel lines orthogonal to said lines of segments of polycrystalline semiconductor and have a truncated rectangular pyramid shape or a trapezoidal cross section along one axis and straight sides or flanks orthogonal to it.

* * * * *